(12) United States Patent
Meyer et al.

(10) Patent No.: US 8,076,180 B2
(45) Date of Patent: Dec. 13, 2011

(54) REPAIRABLE SEMICONDUCTOR DEVICE AND METHOD

(75) Inventors: Thorsten Meyer, Regensburg (DE); Gerald Ofner, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 597 days.

(21) Appl. No.: 12/168,255

(22) Filed: Jul. 7, 2008

(65) Prior Publication Data

US 2010/0001396 A1 Jan. 7, 2010

(51) Int. Cl.
*H01L 21/44* (2006.01)
(52) U.S. Cl. .................. 438/108; 257/E21.499
(58) Field of Classification Search ........... 438/106, 438/107, 109, 4, 928, 113, 108, 689, 690; 257/E21.499, E21.214, E21.237
See application file for complete search history.

(56) References Cited

U.S. PATENT DOCUMENTS

| 5,841,193 A | 11/1998 | Eichelberger |
| 5,884,396 A * | 3/1999 | Lin ................................. 29/827 |
| 6,159,767 A | 12/2000 | Eichelberger |
| 7,294,922 B2 | 11/2007 | Jobetto et al. |
| 7,459,347 B2 * | 12/2008 | Shimanuki et al. ........... 438/123 |
| 2005/0218473 A1 | 10/2005 | Wakisaka |
| 2006/0141666 A1 | 6/2006 | Hanke et al. |
| 2007/0178622 A1 * | 8/2007 | Liu et al. ....................... 438/106 |

FOREIGN PATENT DOCUMENTS

DE 10 2005 057 256 A1 7/2006

* cited by examiner

*Primary Examiner* — Hoa B Trinh
(74) *Attorney, Agent, or Firm* — Dicke, Billig & Czaja, PLLC

(57) ABSTRACT

Repairable semiconductor device and method. In one embodiment a method, provides a first body having a first semiconductor chip and a first metal layer. A second body includes a second semiconductor chip and a second metal layer. Metal of the first metal layer is removed. The first semiconductor chip is removed from the first body. The second body is attached to the first body. The first metal layer is electrically coupled to the second metal layer.

16 Claims, 10 Drawing Sheets

REPAIRABLE SEMICONDUCTOR DEVICE AND METHOD

BACKGROUND

This invention relates to a repairable semiconductor device and a method of repairing a semiconductor device.

Devices including more than one semiconductor chip are gaining interest throughout the semiconductor industry. Such a device may be tested only after the packaging of the device has been finished. If the tests reveal that only one of the semiconductor chips is defective, it may be necessary to discard the respective device.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1A:
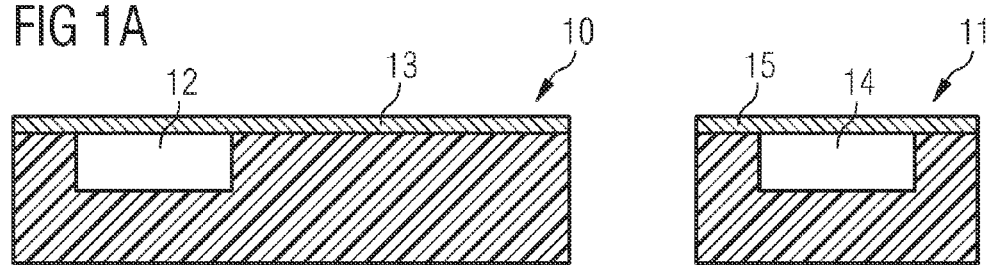
FIGS. 1A to 1E schematically illustrate one embodiment of a method to produce a device.
Figure 1B:
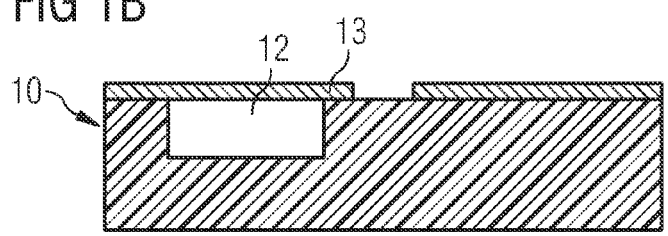
Figure 1C:
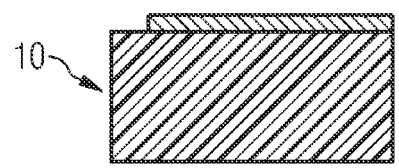
Figure 1D:
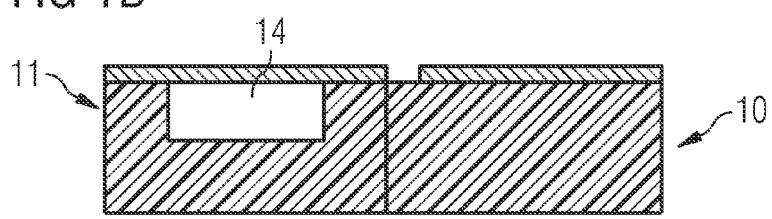

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Devices containing one or more semiconductor chips are described below. The semiconductor chips may be of different types, may be manufactured by different technologies and may include for example integrated electrical, electro-optical or electro-mechanical circuits or passives. The integrated circuits may, for example, be designed as logic integrated circuits, analog integrated circuits, mixed signal integrated circuits, power integrated circuits, memory circuits or integrated passives. Furthermore, the semiconductor chips may be configured as MEMS (micro-electro mechanical systems) and may include micro-mechanical structures, such as bridges, membranes or tongue structures. The semiconductor chips may be configured as sensors or actuators, for example pressure sensors, acceleration sensors, rotation sensors, microphones etc. The semiconductor chips may be configured as antennas and/or discrete passives and/or chip stacks. The semiconductor chips may also include antennas and/or discrete passives. Semiconductor chips in which such functional elements are embedded generally contain electronic circuits which serve for driving the functional elements or further process signals generated by the functional elements. The semiconductor chips need not be manufactured from specific semiconductor material, for example Si, SiC, SiGe, GaAs, and, furthermore, may contain inorganic and/or organic materials that are not semiconductors, such as for example discrete passives, antennas, insulators, plastics or metals. Moreover, the semiconductor chips may be packaged or unpackaged.

The semiconductor chips may have contact pads (or electrodes) which allow electrical contact to be made with the integrated circuits included in the semiconductor chips. One or more metal layers may be applied to the contact pads of the semiconductor chips. The metal layers may be manufactured with any desired geometric shape and any desired material composition. The metal layers may, for example, be in the form of a layer covering an area. Any desired metal or metal alloy, for example from aluminum, titanium, gold, silver, copper, palladium, platinum, nickel, chromium or nickel vanadium, may be used as the material. The metal layers need not be homogenous or manufactured from just one material, that is to say various compositions and concentrations of the materials contained in the metal layers are possible. The contact pads may be situated on the active main surfaces of the semiconductor chips or on other surfaces of the semiconductor chips.

The devices described below include external contact elements or external contact pads, which may be of any shape and size. The external contact elements may be accessible from outside the device and may thus allow electrical contact to be made with the semiconductor chips from outside the device. Furthermore, the external contact elements may be thermally conducting and may serve as heat sinks for dissipating the heat generated by the semiconductor chips. The external contact elements may be composed of any desired electrically conducting material, for example of a metal, such as copper, aluminum or gold, a metal alloy or an electrically conducting organic material. Solder material, such as solder balls or solder bumps, may be deposited on the external contact elements.

The semiconductor chips or at least parts of the semiconductor chips may be covered with an electrically insulating material. The electrically insulating material may be any appropriate duroplastic, thermoplastic or thermosetting material or laminate (prepreg) and may contain filler materials. After its deposition the electrically insulating material may be only partly hardened and may be completely hardened after a heat treatment. Various techniques may be employed to cover the semiconductor chips with the electrically insulating material, for example compression molding, injection molding or lamination.

The electrically insulating material may be used to produce fan-out type packages. In a fan-out type package at least some of the external contact elements and/or conductor tracks connecting the semiconductor chip to the external contact elements are located laterally outside of the outline of the semiconductor chip or do at least intersect the outline of the semiconductor chip. Thus, in fan-out type packages, a peripherally outer part of the package of the semiconductor chip is typically (additionally) used for electrically bonding the package to external applications, such as application boards etc. This outer part of the package encompassing the semiconductor chip effectively enlarges the contact area of the package in relation to the footprint of the semiconductor chip, thus leading to relaxed constraints in view of package pad size and pitch with regard to later processing, e.g., second level assembly.

One or more metal layers may be placed over the electrically insulating material and/or the semiconductor chips. The metal layers may, for example, be used to produce a redistribution layer. The metal layers may be used as wiring layers to make electrical contact with the semiconductor chips from outside the devices and/or to make electrical contact with other semiconductor chips and/or components contained in the devices. The metal layers may be manufactured with any desired geometric shape and any desired material composition. The metal layers may, for example, be composed of conductor tracks, but may also be in the form of a layer covering an area. Any desired metal, for example aluminum, nickel, palladium, silver, tin, gold or copper, or metal alloys may be used as the material. The metal layers need not be homogenous or manufactured from just one material, that is to say various compositions and concentrations of the materials contained in the metal layers are possible. Furthermore, the metal layers may be arranged above or below or between electrically insulating layers.

Parts of the metal layers may be removed, for example in order to remove one or more defective semiconductor chips from the device. Removing the metal from the metal layer may be carried out by using a laser beam or a water jet, mechanical sawing using a saw or a cutter, chemical etching, milling or any other appropriate method. After the replacement of the defective semiconductor chips with fresh semiconductor chips two or more metal layers may be electrically coupled to each other by depositing an electrically conductive material. For this purpose electroless or galvanic deposition or dispensing or printing an electrically conductive adhesive or any other appropriate method may be used.

Figure 1E:
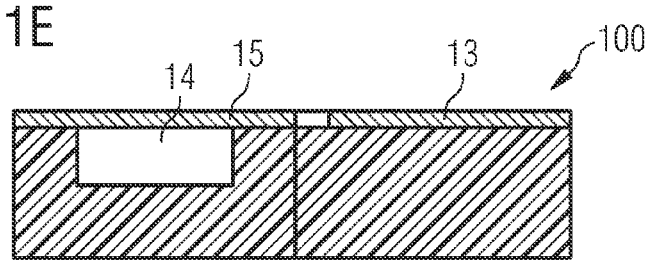

FIGS. 1A to 1F schematically illustrate one embodiment of a method for production of a device 100. A cross section of the device 100 obtained by the method is illustrated in FIG. 1E. Firstly, a first body 10 and a second body 11 are provided (see FIG. 1A). The first body 10 includes a first semiconductor chip 12 and a first metal layer 13. The second body 11 includes a second semiconductor chip 14 and a second metal layer 15. Metal of the first metal layer 13 is removed (see FIG. 1B). Thereafter the first semiconductor chip 12 is removed from the first body 10 (see FIG. 1C) and the second body 11 is attached to the first body 10 (see FIG. 1D). The first metal layer 13 is electrically coupled to the second metal layer 15 (see FIG. 1E).

Figure 2:
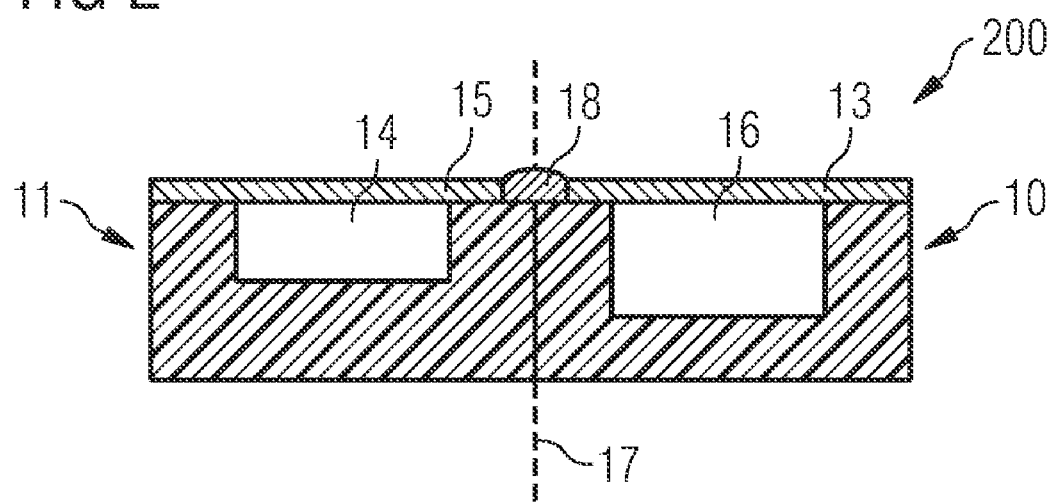
FIG. 2 schematically illustrates a device in one embodiment.

FIG. 2 schematically illustrates one embodiment of a device 200. The device 200 includes a first body 10 with a semiconductor chip 16 and a metal layer 13 and a second body 11 with a semiconductor chip 14 and a metal layer 15. The first body 10 is attached to the second body 11 along a first plane 17. An electrically conductive bulge 18 attaches the metal layer 13 to the metal layer 15. Furthermore, the electrically conductive bulge 18 is arranged in the first plane 17.

Figure 3A:
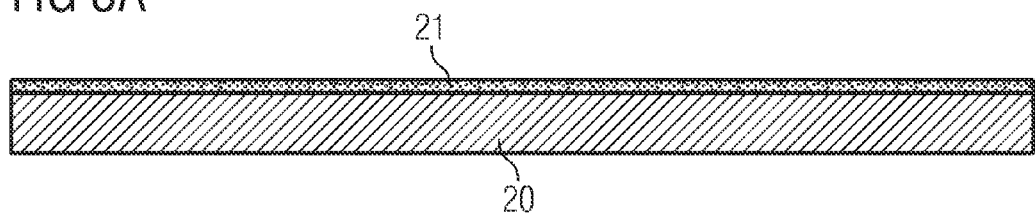
FIGS. 3A to 3Q schematically illustrate one embodiment of a method to produce a device.
Figure 3B:
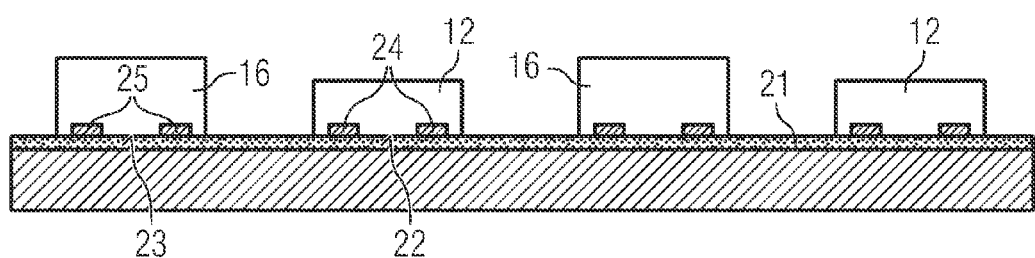
Figure 3C:
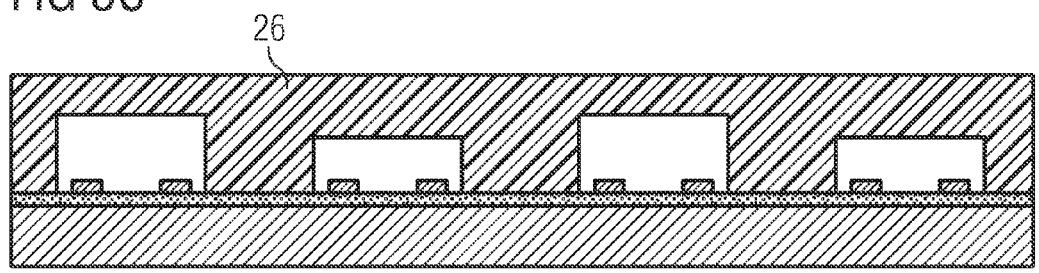
Figure 3D:
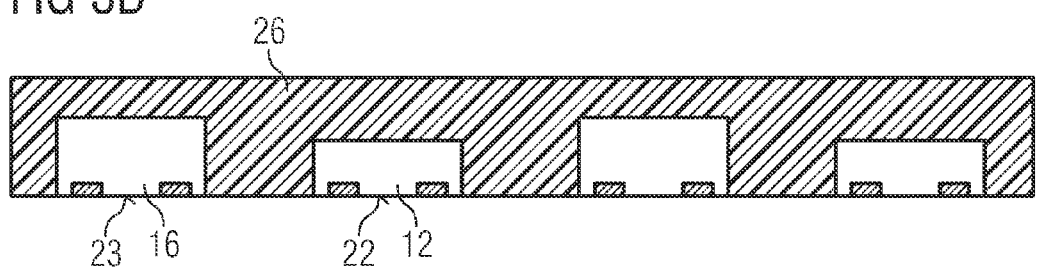
Figure 3E:
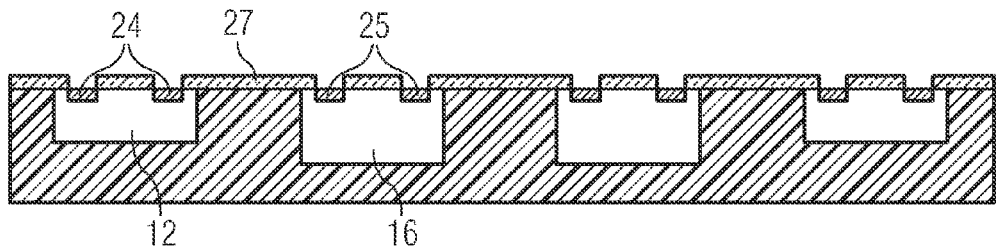
Figure 3F:
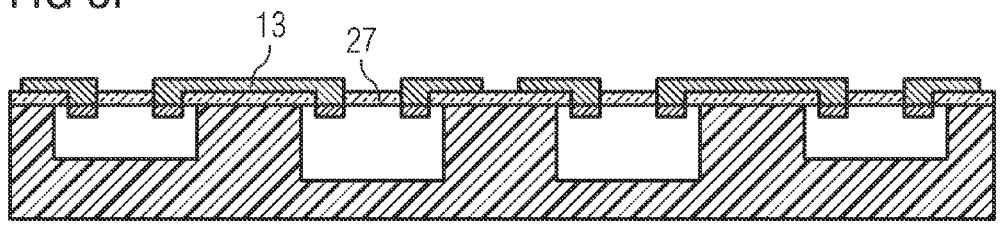
Figure 3G:
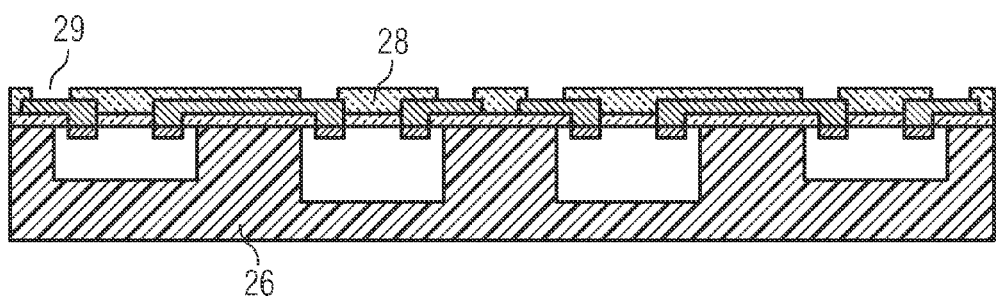
Figure 3H:
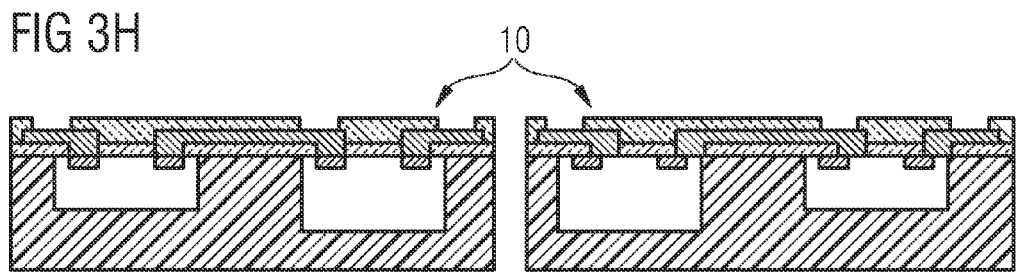
Figure 3I:
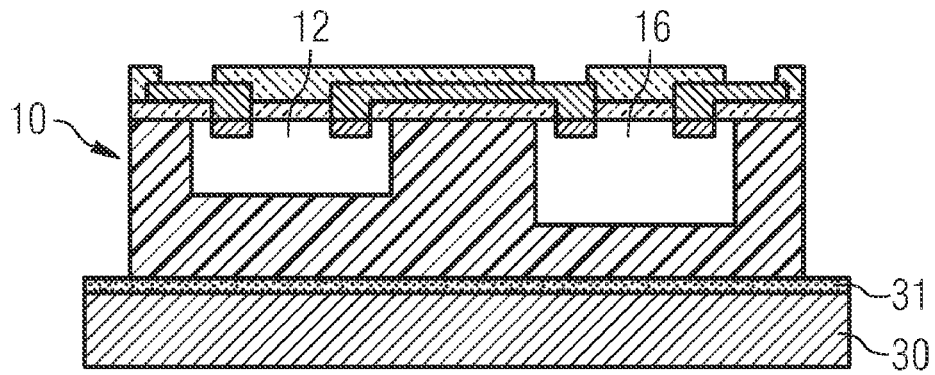
Figure 3J:
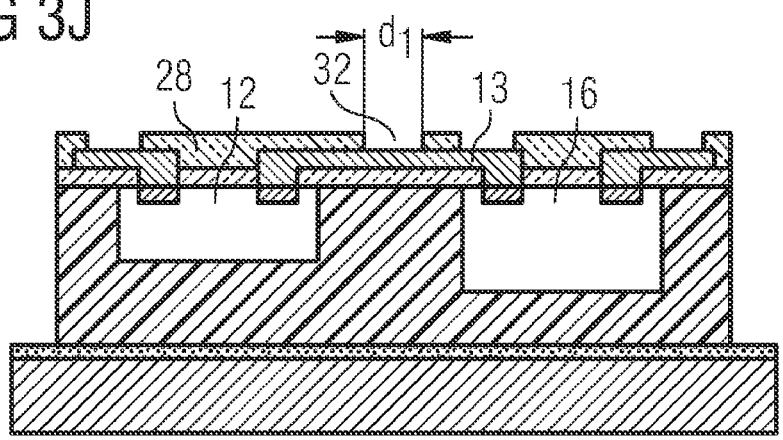
Figure 3K:
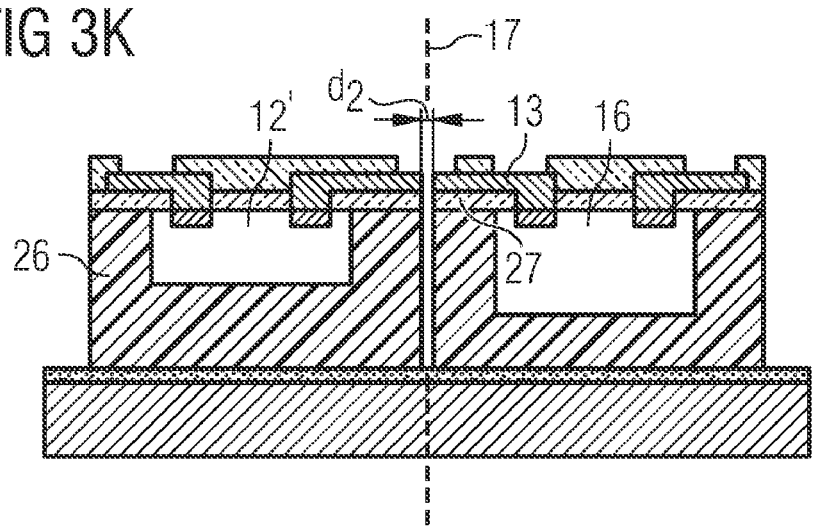
Figure 3L:
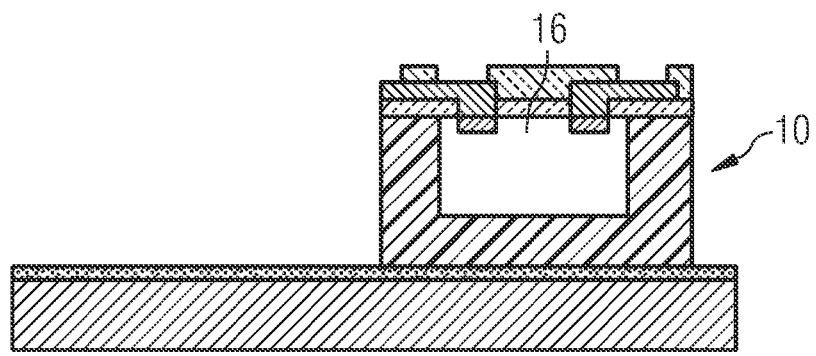
Figure 3M:
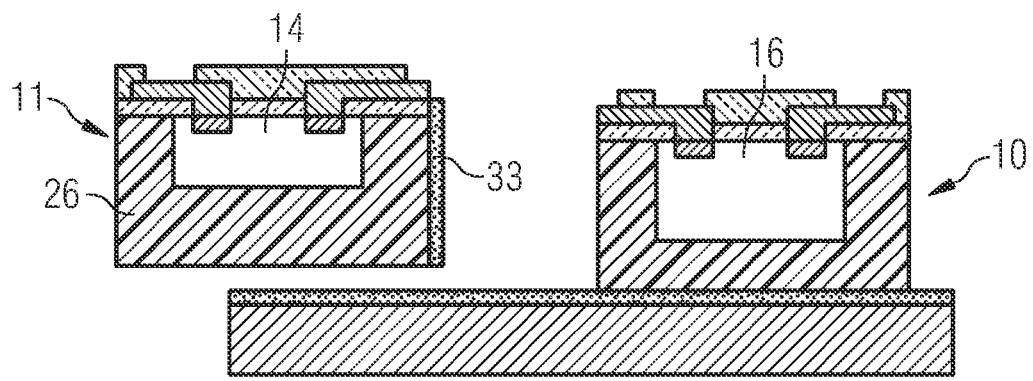
Figure 3N:
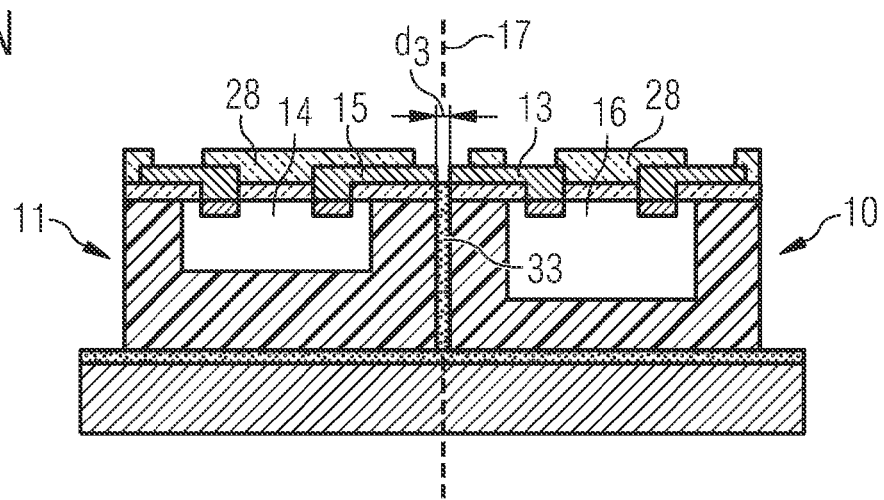
Figure 3O:
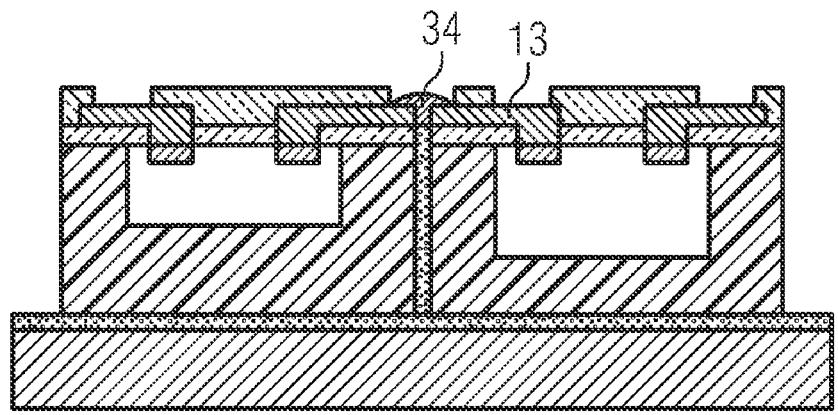
Figure 3P:
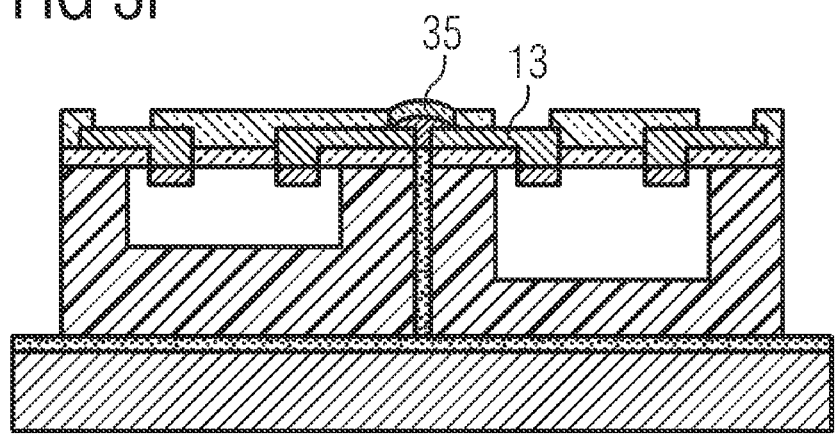
Figure 3Q:
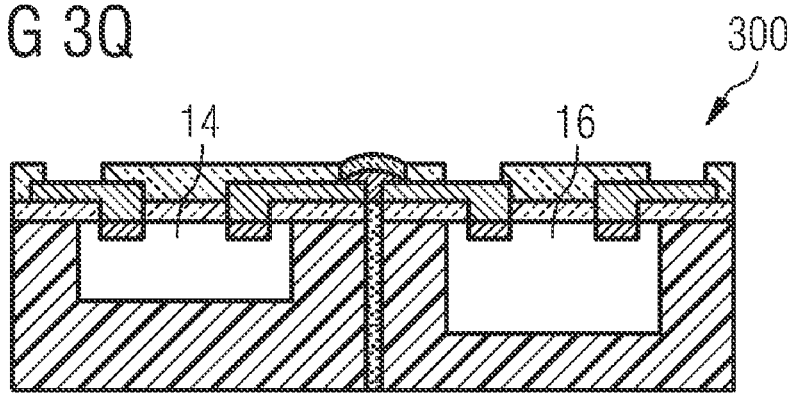

FIGS. 3A to 3Q schematically illustrate one embodiment of a method for production of a device 300, a cross section of which is illustrated in FIG. 3Q. The method illustrated in FIGS. 3A to 3Q is an implementation of the method illustrated in FIGS. 1A to 1E. The details of the production method that are described below can therefore be likewise applied to the method of FIGS. 1A to 1E. Furthermore, the device 300 is an implementation of the device 200. The details of the device 300 that are described below can therefore be likewise applied to the device 200.

In order to manufacture the device 300, a carrier 20 is provided as illustrated in FIG. 3A. The carrier 20 may be a plate made of a rigid material, for example a metal, such as nickel, steel or stainless steel, laminate, film or a material stack. The carrier 20 may have at least one flat surface on which components of the device 300 can be placed. The shape of the carrier 20 is not limited to any geometric shape, for example the carrier 20 may be round or square-shaped. The carrier 20 may have any appropriate size. An adhesive tape 21, for example a double sided sticky tape, may be laminated onto the carrier 20.

As illustrated in FIG. 3B, semiconductor chips 12 and 16 as well as possibly further semiconductor chips are placed over the carrier 20. The semiconductor chips 12 and 16 can be fixed on the adhesive tape 21. For attaching the semiconductor chips 12 and 16 to the carrier 20, other kinds of attaching materials may in one embodiment be used. The semiconductor chips 12 and 16 may be arranged in an array. Furthermore, any suitable array of semiconductor chips may be placed on the carrier 20 (only two of the semiconductor chips 12 and two of the semiconductor chips 16 are illustrated in FIG. 3B).

The semiconductor chips 12 and 16 are relocated on the carrier 20 in larger spacing as they have been in the wafer bond. The semiconductor chips 12 and 16 may have been manufactured on the same semiconductor wafer, but may in one embodiment have been manufactured on different wafers. Furthermore, the semiconductor chips 12 may be physically identical, but may also contain different integrated circuits and/or represent other components. The same may hold true for the semiconductor chips 16. Before the semiconductor chips 12 and 16 are placed on the carrier 20, they may be thinned, for example by grinding their backsides, down to a thickness in the range from 30 to 300 µm. The functions and dimensions of the semiconductor chips 12 may be different from the functions and dimensions of the semiconductor chips 16.

The semiconductor chips 12 and 16 have active main surfaces 22 and 23, respectively, and may be arranged over the carrier 20 with their active main surfaces 22 and 23 facing the carrier 20. The semiconductor chips 12 and 16 may have contact pads 24 and 25 located on their active main surfaces 22 and 23, respectively. The integrated circuits embedded in the semiconductor chips 12 and 16 can be electrically accessed via the contact pads 24 and 25. The contact pads 24 and 25 may be made of a metal, for example aluminum or copper.

After the semiconductor chips 12 and 16 have been mounted on the carrier 20, they are encapsulated by an electrically insulating material 26 thereby forming an layer of the electrically insulating material 26 as illustrated in FIG. 3C. For example, the electrically insulating material 26 may be a duroplastic or thermosetting mold material. The gaps between the semiconductor chips 12 and 16 are also filled with the mold material 26. The mold material 26 may be based on an epoxy material and may contain a filling material consisting of small particles of glass ($SiO_2$) or other electrically insulating mineral filler materials like $Al_2O_3$ or organic filler materials.

As an alternative to the mold material, another polymer material may be used as the electrically insulating material 26 to cover the semiconductor chips 12 and 16. The polymer material 26 may have the shape of an electrically insulating foil or sheet, which is laminated on top of the semiconductor chips 12 and 16 as well as the carrier 20. Heat and pressure may be applied for a time suitable to attach the polymer foil or sheet 26 to the underlying structure. The gaps between the semiconductor chips 12 and 16 are also filled with the polymer material 26. The polymer material 26 may, for example, be a prepreg (short for preimpregnated fibers) that is a combination of a fiber mat, for example glass or carbon fibers, and a resin, for example a duroplastic material. Prepreg materials are usually used to manufacture PCBs (printed circuit boards). Well known prepreg materials that are used in PCB industry and that can be used here as the polymer material 26 are: FR-2, FR-3, FR-4, FR-5, FR-6, G-10, CEM-1, CEM-2, CEM-3, CEM-4 and CEM-5. Prepreg materials are bi-stage materials, which are flexible when applied over the semiconductor chips 12 and 16 and hardened during a heat-treatment. For the lamination of the prepreg the same or similar processes can be used as in PCB manufacturing.

The semiconductor chips 12 and 16 covered with the electrically insulating material 26 are released from the carrier 20, and the adhesive tape 21 is pealed from the semiconductor chips 12 and 16 as well as from the electrically insulating material 26 as illustrated in FIG. 3D. The adhesive tape 21 may feature thermo-release properties, which allow the removal of the adhesive tape 21 during a heat-treatment. The removal of the adhesive tape 21 from the carrier 20 is carried out at an appropriate temperature, which depends on the thermo-release properties of the adhesive tape 21 and is usually higher than 150° C.

After the release of the carrier 20 and the adhesive tape 21 the active main surfaces 22 and 23 of the semiconductor chips 12 and 16 as well as the bottom surface of the electrically insulating material 26 form a common planar surface. As illustrated in FIGS. 3E to 3G, a redistribution layer may be applied to this surface.

In the present embodiment, the redistribution layer includes a dielectric layers 27, a metal layer 13 and a dielectric layer 28. The dielectric layer 27 is deposited on the planar surface formed by the main surfaces 22 and 23 of the semiconductor chips 12 and 16 and the electrically insulating material 26. The metal layer 13 is applied to the dielectric layer 27, with electrical contacts being produced to the contact pads 24 and 25 that are embedded in the active main surfaces 22 and 23 of the semiconductor chips 12 and 16. The dielectric layer 27 has openings in order to produce these contacts. The metal layer 13 may have the function of a wiring layer to couple the semiconductor chips 12 and 16 to each other and/or to other components. Instead of only one wiring layer, it is also possible to use more than one wiring layer if required.

The dielectric layer 28 is subsequently applied to the dielectric layer 27 and the metal layer 13. The dielectric layer 28 is opened in areas where external contact pads 29 are arranged. The external contact pads 29 may be used to electrically couple the semiconductor chips 12 and 16 to other components external of the device 300.

The dielectric layers 27 and 28 may be fabricated in various ways. For example, the dielectric layers 27 and 28 can be deposited from a gas phase or from a solution, or can be laminated onto the semiconductor chips 12 and 16. Furthermore, thin-film technology methods or a standard PCB industry process flow can be used for application of the dielectric layers 27 and 28. Each of the dielectric layers 27 and 28 may be up to 10 μm thick. In order to make electrical contacts, the dielectric layers 27 and 28 may, for example, be opened by using photolithographic methods and/or etching methods.

The metal layer 13 may, for example, be fabricated by means of metallization followed by structuring of the metallization layer in order to form the conductor tracks of the wiring layer. Any desired metal, for example aluminum, nickel, palladium, silver, tin, gold or copper, or metal alloys may be used as the material.

The metal layer 13 may also be generated galvanically. For that, usually a seed layer, for example, a palladium layer, is deposited first, which may be carried out electroless or by using an ink jet printing technique. The seed layer can then be used as an electrode for the galvanic deposition of a further electrically conductive layer, for example a copper layer.

Another technique that may be employed to generated the metal layer 13 is laser direct structuring. In case of laser direct structuring an electrically insulating polymer foil is placed onto the active main surfaces 22 and 23 and the electrically insulating material 26. The circuit definition is done by means of a laser beam, which activates special additives in the polymer foil in order to allow subsequent selective plating.

Solder deposits may be placed onto the external contact pads 29 (not illustrated). The solder deposits may be applied to the redistribution layer by "ball placement", in which pre-shaped balls composed of solder material are applied to the metal layer 13. As an alternative to "ball placement", the solder deposits may, for example, be applied by means of stencil printing with a solder paste, followed by a heat-treatment process. The solder deposits may be used as external contact elements to electrically couple the device 300 to other components, for example a PCB. The dielectric layer 28 may be a solder resist layer that prevents solder from bridging between the conductor tracks and creating short circuits. The dielectric layer 28 also provides protection from the environment.

The solder material may be formed from metal alloys which are composed, for example, from the following materials: SnPb, SnAg, SnAgCu, SnAgCuNi, SnAu, SnCu and SnBi. Instead of the solder deposits, other connecting techniques may be used to electrically couple the encapsulated semiconductor chips 12 and 16 to a PCB, such as for example diffusion soldering or adhesive bonding by means of an electrically conductive adhesive.

As illustrated in FIG. 3H, the devices 10 (or first bodies 10) are separated from one another by separation of the electrically insulating material 26 and the redistribution layer, for example by sawing, etching or a laser beam.

The devices 10 manufactured by the method described above may be fan-out type packages. The layer of the electrically insulating material 26 allows the redistribution layer to extend beyond the outline of the semiconductor chips 12 and 16. The external contact pads 29 therefore do not need to be arranged within the outline of the semiconductor chips 12 and 16, but can be distributed over a larger area. The increased area which is available for arrangement of the external contact pads 29 as a result of the layer of the electrically insulating material 26 means that the external contact pads 29 cannot only be arranged at a great distance from one another, but that the maximum number of external contact pads 29 which can be arranged there is likewise increased compared to the situation when all the external contact pads 29 are arranged within the outline of the semiconductor chips 12 and 16.

After the manufacturing of the devices 10, the semiconductor chips 12 and 16 of each of the devices 10 are tested either individually or as a functional group. If a defective semiconductor chip is identified during a testing process, the defective semiconductor chip is replaced as outlined in the following.

As illustrated in FIG. 3I, the device 10 which is to be repaired is transferred to a carrier 30. In the present embodiment, the semiconductor chip 12 is defective. The carrier 30 may be a plate made of a rigid material, for example a metal, such as nickel, steel or stainless steel, laminate, film or a material stack. The carrier 30 may have any appropriate size and shape. It may be possible to place more than one device on the carrier 30. An adhesive tape 31, for example a double sided sticky tape, may be laminated onto the carrier 30 in order to secure the device 10 on the carrier 30.

In the next process the top dielectric layer 28 functioning as a solder resist layer may be at least partially removed in an area 32 around the defective semiconductor chip 12. For example, the dielectric layer 28 may be removed along a line having a width $d_1$ as illustrated in FIG. 3J (the line with the width $d_1$ is oriented perpendicularly to the drawing plane). The width $d_1$ may, for example, be in the range from 10 to 200 µm or may be larger than 200 µm. Removing the dielectric layer 29 may be carried out by using a laser beam or a water jet, mechanical sawing using a saw or a cutter, etching, milling or any other appropriate method.

After the removal of at least a part of the dielectric layer 28 the underlying metal layer 13 is exposed at the location 32. The metal layer 13 is removed at this location at least partially as illustrated in FIG. 3K. Furthermore, the underlying dielectric layer 27 and the electrically insulating material 26 are also cut. Cutting through the metal layer 13, the dielectric layer 27 and the electrically insulating material 26 along a plane 17 may be carried out by using a laser beam or a water jet, mechanical sawing using a saw or a cutter, etching, milling or any other appropriate method. The width $d_2$ of the cut along the plane 17 may be smaller than the width $d_1$. The width $d_2$ may be depend on the method used for cutting. For example, when a saw is used to saw the material stack, the width $d_2$ may be in the range from 50 to 150 µm. When a laser beam is used, the width $d_2$ may be in the range from 10 to 30 µm. Other values for the width $d_2$ are also possible. The plane 17 may be oriented perpendicularly to the active main surfaces 22 and 23 of the semiconductor chips 12 and 16.

The defective semiconductor chip 12 can then be removed from the carrier 30 as illustrated in FIG. 3L. For example, the semiconductor chip 12 can be removed with a heated rework tool which heats the electrically insulating material 26 surrounding the semiconductor chip 12 so that the semiconductor chip 12 can be withdrawn from the adhesive tape 31.

In the process illustrated in FIG. 3M, the defective semiconductor chip 12 is replaced with an identical semiconductor chip 14. The semiconductor chip 14 is embedded in a second body 11 which has been preprocessed and packaged. The second body 11 may have the same structure as the part of the device 10 including the semiconductor chip 12 which has been removed. The second body 11 may have been preprocessed using the same processes as illustrated in FIGS. 3A to 3H. Multiple semiconductor chips of the same type can be generally processed together to create a large supply of extra semiconductor chips. The semiconductor chip 14 may be tested before it is placed on the carrier 30.

It may be provided that at least one side surface of the electrically insulating material 26 of the second body 11 which is attached to the remaining part of the device 10 is coated with an adhesive material 33. As illustrated in FIG. 3N, the second body 11 may be placed on the carrier 30 at the same position where the semiconductor chip 12 has been removed. Thus, the second body 11 adjoins to the remaining part of the device 10 at the plane 17. The adhesive material 33 fastens the two bodies 10 and 11 on each other and is located in the plane 17.

As can be seen from FIG. 3N, the second body 11 has a metal layer 15 which is adjacent to the metal layer 13. The metal layer 15 is electrically coupled to the semiconductor chip 14 in the same way as the metal layer 13 was coupled to the semiconductor chip 12 before. The distance $d_3$ between the metal layers 13 and 15, i.e. the gap between the bodies 10 and 11, may be smaller than 200 µm or 100 µm or 50 µm or 10 µm.

As an alternative the adhesive material 33 may also be applied to the remaining part of the device 10 before the second body 11 is placed on the carrier 30. Furthermore, instead of pre-applying the adhesive material 33 to one of the bodies 10 and 11, the bodies 10 and 11 may be fixed to each other by underfilling on the carrier 30. The underfiller material may be based on an epoxy material and may contain a filling material consisting of small particles of glass ($SiO_2$) or other electrically insulating mineral filler materials like $Al_2O_3$ or organic filler materials. In general, the material which is used to attach the two bodies 10 and 11 to each other may be different from the electrically insulating material 26.

As can be seen from FIG. 3N, at least a part of the metal layer 15 which is adjacent to the plane 17 is not covered with the dielectric layer 28. Thus, portions of both metal layers 13 and 15 adjacent to the interconnect plane 17 are exposed from the dielectric layer 28. This exposed areas may be used to deposit electrically conductive material 34 in order to electrically couple the two metal layers 13 and 15 to each other. The deposition of the electrically conductive material may be carried out by electroless and/or galvanically depositing a suitable metal or metal alloy. Furthermore, (wire-) bonding, printing, ink jet printing, dispensing, any kind of plug-in connection or other appropriate techniques may be employed. As a further alternative, an electrically conductive adhesive material may be deposited on the gap between the two metal layers 13 and 15. The electrically conductive adhesive material may consist of a paste containing metal particles. Due to the deposition method of the electrically conductive material 34, the electrically conductive material 34 forms a bulge in the plane 17 as can be seen from FIG. 3O. The bulge formed by the electrically conductive material 34 may protrude from the upper surface of the metal layer 13 for more than 1 µm or 10 µm or 50 µm or 100 µm. The electrically conductive material 34 may be different from the material of the metal layers 13 and 15.

In order to protect the electrically conductive material 34, a dielectric material 35 may be deposited on the electrically conductive material 34 as illustrated in FIG. 3P. The dielectric material 35 may be applied by printing, dispensing, lamination or other suitable techniques.

The repaired device 300 containing the original semiconductor chip 16 and the replaced semiconductor chip 14 is then released from the carrier 30 as illustrated in FIG. 3Q. The adhesive tape 31 may feature thermo-release properties, which allow the removal of the adhesive tape 31 during a heat-treatment.

It is obvious to a person skilled in the art that the device 300 illustrated in FIG. 3Q and the manufacturing thereof as described above are only intended to be an exemplary embodiment, and many variations are possible. For example, more than two semiconductor chips or passives of different types may be included in the same device 300. The semiconductor chips and passives may differ in function, size, manufacturing technology etc.

Furthermore, the redistribution layer may contain more than one metal layer. These metal layers may be stacked on top of each other and dielectric layers may be arranged between adjacent metal layers. In this case, the processes illustrated in FIGS. 3O and 3P may be carried out to repair each of the metal layers after the replacement of one of the semiconductor chips.

According to a further embodiment, the devices 10 are manufactured with openings in the dielectric layer 28 at locations 32 as illustrated in FIG. 3J. If one of the semiconductor chips 12 and 16 is found to be defective after the manufacturing of the device 10, the process of removing the dielectric layer 28 at the location 32 can be omitted (see FIG. 3J). If the tests reveal that all semiconductor chips of the device 10 are working properly, dielectric material may be deposited at the locations 32 afterwards.

In FIGS. 4A to 4F different stages of repairing a device 400 are exemplarily illustrated. The details of the method illustrated in FIGS. 4A to 4F can be likewise applied to the methods illustrated in FIGS. 1A to 1E and 3A to 3Q.

Figure 4A:
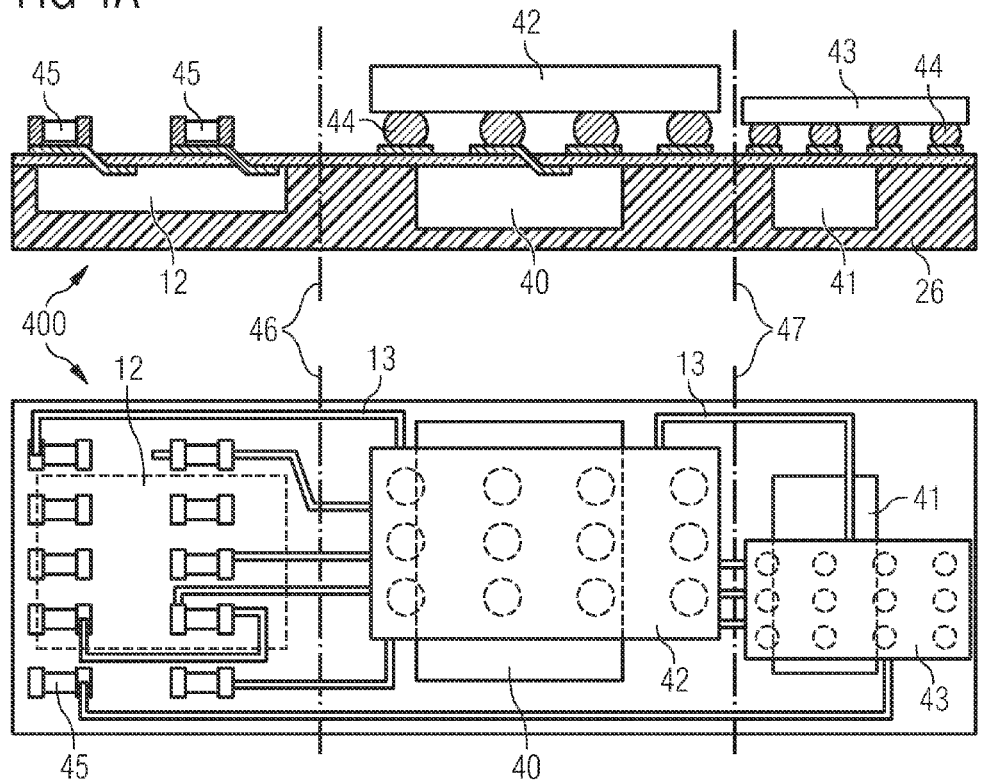
FIGS. 4A to 4F schematically illustrate one embodiment of a method to produce a device.

In FIG. 4A the device 400 is illustrated in side view (top) and top view (bottom). The device 400 includes semiconductor chips 12, 40 and 41, which are embedded in an electrically insulating material 26. This part of the device 400 may be fabricated by a method as illustrated in FIGS. 3A to 3H. Further semiconductor chips 42 and 43 are mounted on a redistribution layer, which is arranged on top of the electrically insulating material 26, by using solder balls 44. Furthermore, passive components 45 may be attached to the redistribution layer. The redistribution layer contains at least one metal layer 13 in the form of a wiring layer which electrically couples the components of the device 400 to each other. When tested, it may have been found out that the semiconductor chip 12 is defective. The replacement of the semiconductor chip 12 with an identical semiconductor chip 14 is described in the following.

The device 400 may, for example, be a module part of a mobile phone or any other application. The mobile phone may be assembled of several module parts and each of the module parts may have a specific functionality, such as camera, display, main CPU, keyboard, etc. In some cases, the module parts cannot be tested before the module parts are assembled.

If active or passive packages are attached to the device 400, these packages may be removed, for example by de-soldering, before the repair process is started. As can be seen from FIG. 4A, the device 400 has two repair positions 46 and 47. The repair positions 46 and 47 are planes through the device 400 at locations where no semiconductor chips or passives are located. The redistribution layer and the electrically insulating material 26 of the device 400 may be cut through at the repair positions 46 and 47 in order to replace components of the device 400. When designing a device, those repair positions may be taken into consideration in order to be able to repair the device after manufacturing.

Figure 4B:
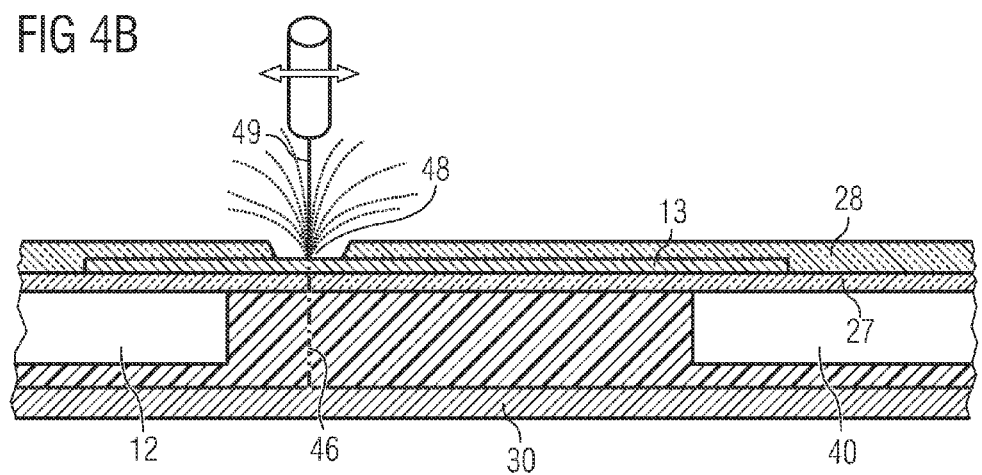

As illustrated in FIG. 4B, the device 400 may be transferred to a carrier 30 and the top dielectric layer 28 functioning as a solder resist layer may be at least partially removed in an area around the repair position 46 in order to create a repair opening 48. A laser beam 49 may be employed to remove the dielectric layer 28 from the repair opening. Other techniques to create the repair opening 48 may in one embodiment be used as described above in connection with FIG. 3J.

Figure 4C:
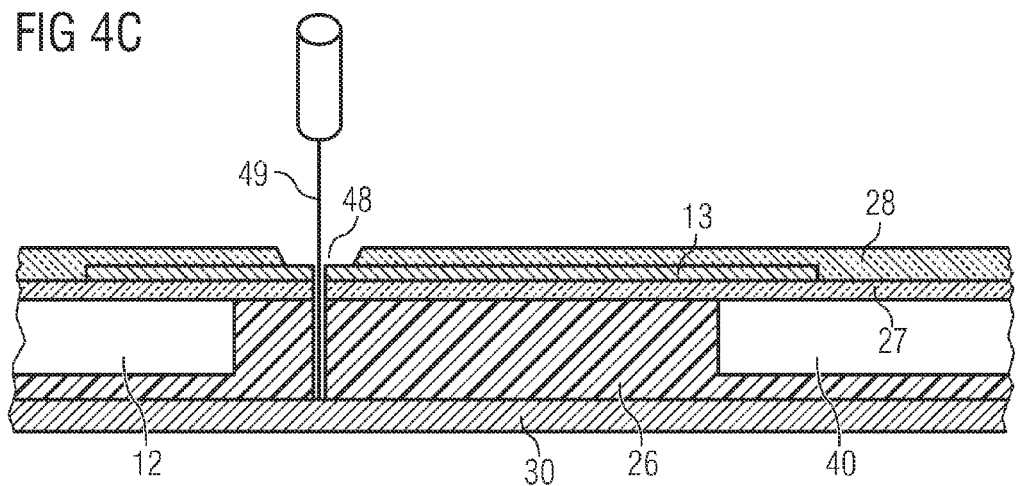

After the removal of the dielectric layer 28 the underlying metal layer 13 is exposed at the repair opening 48. The metal layer 13, the underlying dielectric layer 27 and the electrically insulating material 26 are then cut along the plane of the repair position 46. This may be carried out by using the laser beam 49 or, in one embodiment, a water jet, mechanical sawing using a saw or a cutter, etching, milling or any other appropriate method. The width of the cut through the metal layer 13, the dielectric layer 27 and the electrically insulating material 26 may be smaller than the width of the repair opening 48 as illustrated in FIG. 4C.

Figure 4D:
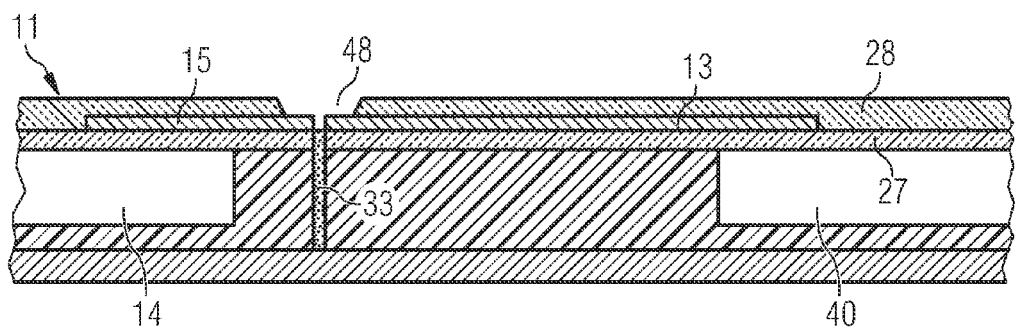
Figure 4E:
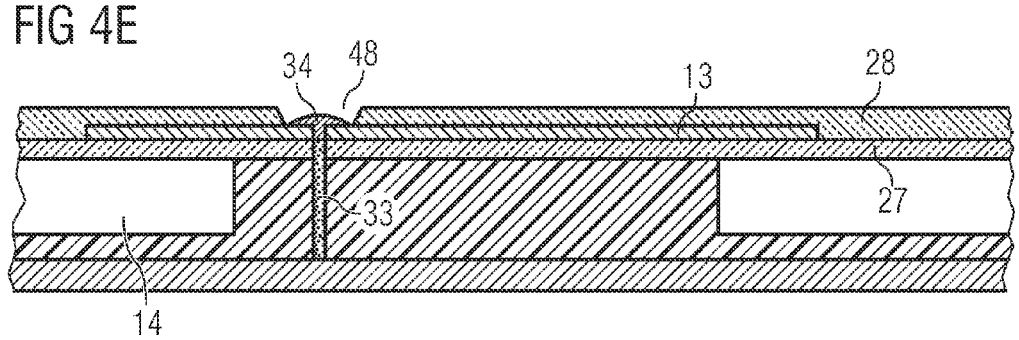

The part of the device 400 including the defective semiconductor chip 12 can then be removed from the carrier 30. As illustrated in FIG. 4D, the defective semiconductor chip 12 is replaced with an identical semiconductor chip 14. The semiconductor chip 14 is embedded in a body 11 which has been preprocessed and packaged. The body 11 may have the same structure as the part of the device 400 including the semiconductor chip 12 which has been removed. The semiconductor chip 14 may be tested before it is placed on the carrier 30.

It may be provided that at least one side surface of the electrically insulating material 26 of the body 11 which is attached to the remaining part of the device 400 is coated with an adhesive material 33. As illustrated in FIG. 4D, the body 11 may be placed on the carrier 30 at the same position where the semiconductor chip 12 has been removed. Thus, the body 11 adjoins to the remaining part of the device 400 at the repair position 46. The adhesive material 33 fastens the body 11 to the device 400. As an alternative, the adhesive material 33 may also be applied to the remaining part of the device 400 before the body 11 is placed on the carrier 30. Furthermore, instead of using the adhesive material 33, the body 11 may be fixed to the device 400 by underfilling on the carrier 30. The material which is used to attach the body 11 to the device 400 may be different from the electrically insulating material 26.

As can be seen from FIG. 4D, the body 11 has a metal layer 15 which is adjacent to the metal layer 13. The metal layer 15 is electrically coupled to the semiconductor chip 14 in the same way as the metal layer 13 was coupled to the semiconductor chip 12 before.

At least a part of the metal layer 15 which is adjacent to the repair position 46 is not covered with the dielectric layer 28. Thus adjacent portions of both metal layers 13 and 15 are exposed from the dielectric layer 28. This exposed areas may be used to deposit electrically conductive material 34 in order to electrically couple the two metal layers 13 and 15 to each other. The deposition of the electrically conductive material 34 may be carried out by electroless and/or galvanically depositing a suitable metal or metal alloy. Furthermore, printing, ink jet printing, dispensing or other appropriate techniques may be employed. As a further alternative, an electrically conductive adhesive material may be deposited on the gap between the two metal layers 13 and 15. Due to the deposition method of the electrically conductive material 34, the electrically conductive material 34 forms a bulge at the repair position 46 as can be seen from FIG. 4E. The bulge formed by the electrically conductive material 34 may protrude from the upper surface of the metal layer 13 for more than 1 μm or 10 μm or 50 μm or 100 μm. The electrically conductive material 34 may be different from the material of the metal layers 13 and 15.

Figure 4F:
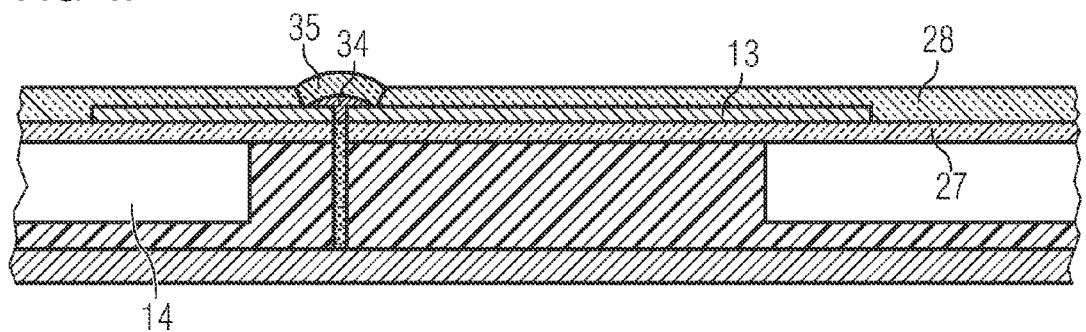

In order to protect the electrically conductive material 34, a dielectric material 35 may be deposited on the electrically conductive material 34 as illustrated in FIG. 4F. The dielectric material 35 may be applied by printing, dispensing, lamination or other suitable techniques. The dielectric material 35 may be the same material as the material used for the dielectric layer 28. The repaired device 400 containing the replaced semiconductor chip 14 is then released from the carrier 30.

Figure 5:
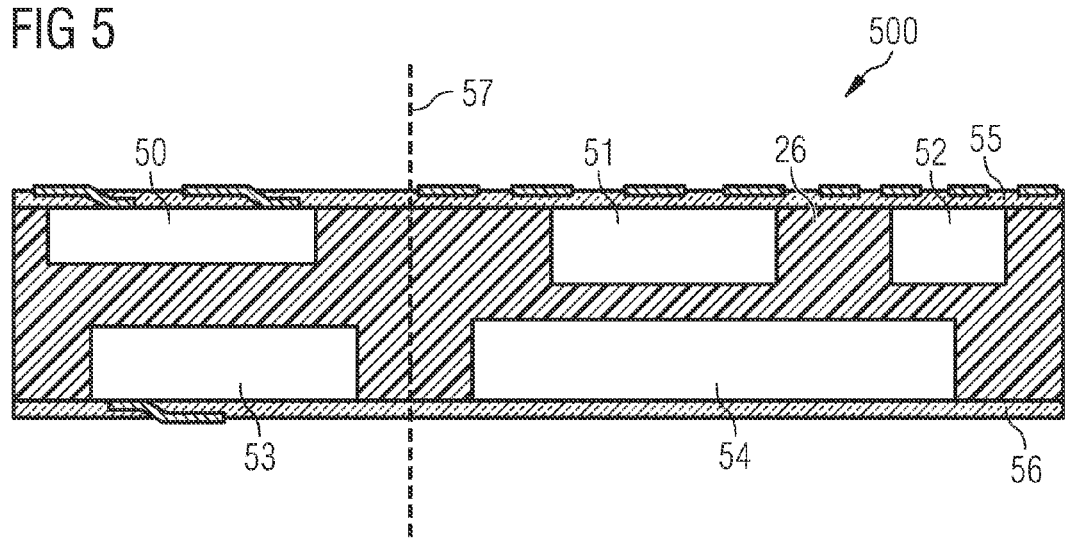
FIG. 5 schematically illustrates one embodiment of a device.

A device 500 is schematically illustrated in FIG. 5 which includes five semiconductor chips 50 to 54 which are embedded in an electrically insulating material 26. Moreover, the device 500 includes redistribution layers 55 and 56 arranged at the top side and the bottom side of the device 500, respectively. The active main surfaces of the semiconductor chips 50 to 52 face the redistribution layer 55, whereas the active main surfaces of the semiconductor chips 53 and 54 face the redistribution layer 56. The device 500 has one repair position 57 located laterally between the semiconductor chips 53 and 54. At this location the redistribution layers 55 and 56 and the electrically insulating material 26 can be cut through without damaging one of the semiconductor chips 50 to 54. Thus at this position, the semiconductor chips 50 and 53 may be separated from the semiconductor chips 51, 52 and 54 and vice versa. Such repair positions can be foreseen when designing a device in order to allow the replacement of defective semiconductor chips after the manufacturing of the device.

In addition, while a particular feature or aspect of an embodiment of the invention may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". The terms "coupled" and "connected", along with derivatives may have been used. It should be understood that these terms may have been used to indicate that two elements co-operate or interact with each other regardless whether they are in direct physical or electrical contact, or they are not in direct contact with each other. Furthermore, it should be understood that embodiments of the invention may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

What is claimed is:

1. A method, comprising:
providing a first body comprising a first semiconductor chip and a first metal layer;
providing a second body comprising a second semiconductor chip and a second metal layer;
partially removing the first metal layer;
removing the first semiconductor chip from the first body;
attaching the second body to the first body; and
electrically coupling the first metal layer to the second metal layer.

2. The method of claim 1, comprising wherein the distance between the first metal layer and the second metal layer is less than 100 μm after the attachment of the second body to the first body.

3. The method of claim 1, comprising electrically coupling the first metal layer to the second metal layer by electrochemically depositing an electrically conductive material or applying an electrically conductive adhesive.

4. The method of claim 1, comprising:
forming a gap between the first metal layer and the second metal layer when the second body is attached to the first body; and
filling the gap with an electrically conductive material in order to electrically couple the first metal layer to the second metal layer.

5. The method of claim 4, comprising depositing a dielectric material on the electrically conductive material.

6. The method of claim 1, wherein the first body comprises an electrically insulating material and the electrically insulating material is cut through in order to remove the first semiconductor chip from the first body.

7. The method of claim 6, comprising wherein the electrically insulating material is a mold material or a laminate material.

8. The method of claim 1, comprising cutting through the first body and the first metal layer along a first plane, the second body has a second plane, the second metal layer abutting against the second plane, and attaching the second plane to the first plane when the second body is attached to the first body.

9. The method of claim 1, wherein the first body comprises a third semiconductor chip and the first metal layer electrically couples the first semiconductor chip to the third semiconductor chip.

10. The method of claim 1, comprising wherein a dielectric layer covers the first metal layer and the dielectric layer is partially removed before partially removing the first metal layer.

11. The method of claim 10, comprising exposing a portion of the first metal layer from the dielectric layer after the attachment of the second body to the first body.

12. The method of claim 1, wherein a third body comprising a fourth semiconductor chip is attached to the first body and the third body is removed from the first body before partially removing the first metal layer.

13. The method of claim 1, comprising using an adhesive material or an underfiller material to attach the second body to the first body.

14. A method, comprising:
providing a first body comprising a first electrically insulating material, at least a first and a second semiconductor chip embedded in the first electrically insulating material and a first metal layer;
providing a second body comprising a second electrically insulating material, a third semiconductor chip embedded in the second electrically insulating material and a second metal layer;
separating the first semiconductor chip from the second semiconductor chip by cutting through the first metal layer and the first electrically insulating material along a first plane;
attaching the second body to the first plane of the first body; and
electrically coupling the first metal layer to the second metal layer.

15. The method of claim 14, comprising electrically coupling the first metal layer to the second metal layer by electrochemically depositing an electrically conductive material or applying an electrically conductive adhesive.

16. The method of claim 14, wherein the second electrically insulating material forms a second plane of the second body, the second metal layer abuts on the second plane, and the second plane of the second body is attached to the first plane of the first body.

* * * * *